United States Patent
Suh

(10) Patent No.: US 7,304,908 B2
(45) Date of Patent: Dec. 4, 2007

(54) SRAM DEVICE CAPABLE OF PERFORMING BURST OPERATION

(75) Inventor: Young-Ho Suh, Suwon-si (KR)

(73) Assignee: Samsung Electronics, Co., Ltd., Suwon (KR)

(*) Notice: Subject to any disclaimer, the term of this patent is extended or adjusted under 35 U.S.C. 154(b) by 0 days.

(21) Appl. No.: 11/333,650

(22) Filed: Jan. 17, 2006

(65) Prior Publication Data

US 2006/0158952 A1 Jul. 20, 2006

(30) Foreign Application Priority Data

Jan. 15, 2005 (KR) .................. 10-2005-0003995

(51) Int. Cl.
G11C 8/00 (2006.01)
(52) U.S. Cl. .................. 365/233; 365/154; 365/230.03
(58) Field of Classification Search ................ 365/154, 365/230.03, 233
See application file for complete search history.

(56) References Cited

U.S. PATENT DOCUMENTS 5,991,223 A * 11/1999 Kozaru et al. ......... 365/230.03
6,438,055 B1 * 8/2002 Taguchi et al. ............. 365/222

FOREIGN PATENT DOCUMENTS

JP 07-230691 8/1995
JP 2001-084762 3/2001

* cited by examiner

*Primary Examiner*—Hoai V. Ho
(74) *Attorney, Agent, or Firm*—F. Chau & Associates, LLC

(57) ABSTRACT

Memory devices are provided which are capable of performing burst operations by simultaneously writing/reading a plurality of data bits to/from memory in response to a selection of a single wordline, and which are capable of controlling data input/output for interruption of burst operation interruptions without having to employ complex control circuitry.

13 Claims, 12 Drawing Sheets

SRAM DEVICE CAPABLE OF PERFORMING BURST OPERATION

CROSS-REFERENCE TO RELATED PATENT APPLICATION

This application claims priority to Korean Patent Application No. 10-2005-0003995, filed on Jan. 15, 2005, in the Korean Intellectual Property Office, the disclosure of which is incorporated herein in its entirety by reference.

BACKGROUND

1. Field of the Invention

The present invention relates to static random access memory (SRAM) devices capable of performing burst operations, and more particularly, to SRAM memory devices capable of performing burst operations by simultaneously writing/reading a plurality of data bits to/from memory in response to a selection of a single wordline, and which are capable of controlling data input/output for interruption of burst operation interruptions without having to employ complex control circuitry.

2. Description of the Related Art

In general, a burst operation is a rapid data access process that that automatically writes/reads a block of data to/from a series of consecutive addresses in response to an input of one external address. More specifically, when an external first (burst) address is applied to a memory device capable of performing a burst operation, the memory device will automatically determine a plurality of addresses that follow the first (burst) address without having to perform a decoding operation every cycle of a clock signal to select a plurality of memory cells respectively corresponding to the addresses following the first address. For example, assume a burst operation has a burst length of 8 bits. When an external first address is received and decoded by the memory device, seven addresses subsequent to the first address are automatically generated by the memory device internally, thus obviating the need to perform a decoding operation on eight addresses every cycle of the clock signal and allowing rapid data access of memory cells by performing a single address decoding operation.

FIG. 1 is a block diagram illustrating a conventional architecture of an SRAM device 100, which is capable of performing a burst operation. Referring to FIG. 1, the SRAM device 100 includes a memory block MBLK having a plurality of memory cells arranged in rows and columns. The memory cells in a given row are commonly connected by one of p wordlines ($WL_1$~$WL_p$) which are selectively activated under operation of a row decoder 110. The memory block MBLK includes i column units (C0, C1 . . . Ci−1), where each column unit includes a column of memory cells commonly connected to a corresponding one of i bit line pairs including a bitline BL and complementary bitline /BL. Each column unit (C0~Ci−1) includes a column decoder CD, which selectively activates a corresponding bitline pair BL and /BL.

The memory device 100 further comprises a peripheral circuit unit 120 connected to the memory block MBLK, which amplifies and outputs data that is read from the memory block MBLK, and which receives and writes data to be stored to the memory block MBLK. The memory block MBLK and the peripheral circuit unit 120 are connected to each other by a pair of data lines DL and /DL, wherein a data line DL is commonly coupled to the bit lines BL and wherein a complementary data line /DL is commonly coupled to the complementary bit lines /BL.

FIG. 2 is a block diagram illustrating a conventional architecture of the peripheral circuit unit 120 of FIG. 1. Referring to FIG. 2, the peripheral circuit unit 120 includes a sense amplification circuit S/A 121, which operates in response to a read control signal PSA, and a write driver W/D 122, which operates in response to a write control signal PWD. For the convenience of explanation, a data output buffer 210 and a data input buffer 220 are illustrated in FIG. 2 together with the peripheral circuit unit 120.

In general, with the conventional SRAM device 100 of FIG. 1 and peripheral circuit framework of FIG. 2, a read operation can be performed by selecting one of the p wordlines ($WL_1$~$WL_p$) and one of the i bitline pairs BL, /BL to access data of a predetermined memory cell of the memory block MBLK. The data which is read from the selected memory cell is then transmitted via a pair of data lines DL and /DL to the peripheral circuit unit 120 and amplified by the sense amplification circuit S/A 121. Thereafter, the amplified data is transmitted to the data output buffer 210 and then output to an external input/output (I/O) terminal. On the other hand, with a write operation, data input to the external I/O terminal is first stored in the data input buffer 220, then transmitted to the write driver W/D 122, and then output to the data line pair DL, /DL to be written to predetermined memory cell that corresponds to a selected wordline and bit-line pair.

FIG. 3A is a timing diagram illustrating a conventional read burst operation that can be performed by the SRAM device 100 of FIG. 1, and FIG. 3B is a timing diagram illustrating a conventional write burst operation that can be performed by the SRAM device 100 of FIG. 1. Referring initially to FIG. 3A, assume that the burst length is 8 bits, i.e., an address designating a memory cell from which data is to be output is comprised of 8 bits. A burst operation can be performed by reading 8-bit data memory cells connected to a wordline WL corresponding to an address A0 as follows. To output a first data bit Q00, an external address A0 is received and decoded to activate a corresponding wordline WL and a column decoder selection signal Y0 is applied to the column decoder in column unit C0 to select a memory cell at column address A00. A read control signal PSA0 then activates the sense amplification circuit S/A 121 of FIG. 2 and data bit Q00 is output. To output a second data bit Q01, the wordline WL corresponding to address A0 is activated again and a column decoder selection signal Y1 is applied to the column decoder in column unit C1 to select a memory cell at column address A01. A read control signal PSA1 then activates the sense amplification circuit S/A 121 of FIG. 2 and data bit Q01 is output. This process is repeated again thereafter to sequentially output data bits Q02~Q07, thus completing an 8-bit burst operation for address A0. With this process, the wordline for address A0 is repeatedly activated over column addresses A00~A07 to output the 8-bit data Q00~Q07.

Referring to FIG. 3B, assuming that the burst length is 8 bits, a burst operation can be performed by writing 8-bit data to memory cells connected to a wordline WL corresponding to an address A0 as follows. To store a first data bit D00, an external address A0 is received and decoded to activate a corresponding wordline WL and a column decoder selection signal Y0 is applied to the column decoder in column unit C0 to select a memory cell at column address A00. A write control signal PWD0 then activates the write driver circuit W/D 122 of FIG. 2 and data bit D00 is stored as the memory cell selected by A0 and A00. To store a second data bit D01, the wordline WL corresponding to address A0 is activated again and a column decoder selection signal Y1 is applied to the column decoder in column unit C1 to select a memory cell. A write control signal PWD1 activates the write driver circuit W/D 122 of FIG. 2 and data bit D01 is output. This process is repeated again thereafter to sequentially store data bits D02~D07, thus completing an 8-bit burst operation for address A0. With this process, the wordline for address A0 is repeatedly activated to store the 8-bit data D00~D07.

As described above, with the conventional SRAM device 100, a data access operation is performed by activating one of the p wordlines ($WL_1$~$WL_p$) and one of the i bitline pairs BL and /BL to select one memory cell and read/write one data bit. In this regard, although the SRAM circuitry for writing/reading data to/from each of the memory cells in the memory block MBLK is relatively simple, the SRAM device 100 consumes a considerable amount of current when having to activate a wordlines WL to perform a data access operation for one memory cell (i.e., one data bit). Indeed, in the conventional burst operations of FIGS. 3A and 3B, the SRAM device 100 drives almost all of its circuit units, including the memory block MBLK and the peripheral circuit unit 120, every cycle of a clock signal, which increases power consumption and reduces operating speed of the SRAM device 100.

SUMMARY OF THE INVENTION

Exemplary embodiments of the invention generally include SRAM memory devices capable of performing burst operations by simultaneously writing/reading a plurality of data bits to/from memory in response to a selection of a single wordline, and which are capable of controlling data input/output for interruption of burst operation interruptions without having to employ complex control circuitry.

In one exemplary embodiment of the invention, a memory device capable of performing a burst operation includes a memory block comprising j sub-memory blocks, and j peripheral circuit units that control input/output of data to/from a corresponding one of the j sub-memory blocks. During an n-bit burst operation, n of the j peripheral circuit units simultaneously write/read 1 bit of n-bit data to/from their corresponding sub-memory blocks upon activation of one wordline. When an n-bit burst operation is terminated in response to a new write or read command, and a portion of the n-bit data is stored in the peripheral circuit units, the peripheral circuit units control reading/writing of the stored portion of the n-bit data in response to a flag signal.

Each of the peripheral circuit units may include: a write driver which writes data to the memory block in response to a write control signal; a sense amplification circuit which amplifies data output from the memory block and outputs the amplified data in response to a read control signal; a first storage unit which latches the amplified data output from the sense amplification circuit and outputs the latched data in response to a first control signal; a second storage unit which latches data and applies the latched data to the write driver in response to a second control signal; and a third storage unit which outputs data stored in the second storage unit in response to a third control signal.

During a burst operation, the first storage unit sequentially outputs the latched n-bit data, and the second storage unit sequentially latches n-bit data and simultaneously applies the latched n-bit data to the write driver, if a burst stop operation for terminating the burst operation in response to a new read command or a new write command issued during the burst operation is performed, part of the n-bit data is stored in the first or second storage unit, and the first through third storage units write the data stored in the first or second storage unit to the memory block or output the data stored in the first or second storage unit in response to the flag signal.

The peripheral circuit unit may also include a flag generation unit, and if a burst stop operation is performed during a burst operation before the inputting of the n-bit data is complete and thus only part of the n-bit data is stored in the second storage unit, the flag generation unit may generate the flag signal for controlling the data stored in the second storage unit to be applied to the write driver.

If a burst stop operation is performed during a burst operation so that only part of the n-bit data can be stored in the second storage unit and the remaining data is stored in the memory cells and there is a need to read previously written data in response to a new read command issued after the burst stop operation, the flag signal generation unit may choose part of the data stored in the second storage unit, output the chosen data to outside the memory device through the third storage unit and control parts of the n-bit data that have not been stored in the second storage unit to be output from the memory block.

The flag signal generation unit may include: a first transistor which is connected between a power supply and a control node and has a gate to which an inverted signal of the second control signal is applied; a second transistor which is connected between the control node and a ground and has a gate to which the write control signal is applied; a delay unit which delays an output of the control node and outputs the delayed result; and a logic OR unit which performs a logic OR operation on the output of the control node and an output of the delay unit, thereby generating the flag signal.

Each of the peripheral circuit units may also include: a first control unit which performs a logic AND operation on the inverted signal of the flag signal and a first preliminary control signal, thereby generating the first control signal; a second control unit which performs a logic AND operation on the flag signal and a second preliminary control signal, thereby generating the write control signal; and a third control unit which performs a logic AND operation on the flag signal and a third preliminary control signal, thereby generating the third control signal.

The first preliminary control signal may be a pulse signal activated whenever the sense amplification circuit outputs data in response to the read command, the second preliminary control signal may be a pulse signal activated whenever data is input in response to the write command, and the third preliminary control signal may be a pulse signal whenever a read address that is the same as a most recently input write address is input.

The flag signal may be activated to a first logic level when the second control signal is activated and may be inactivated to a second logic level when the write control signal is activated to the first logic level.

The first through third storage units may be flip-flops.

The memory device may be a static random access memory (SRAM) device. j may be not smaller than n.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS OF THE INVENTION

Figure 4:
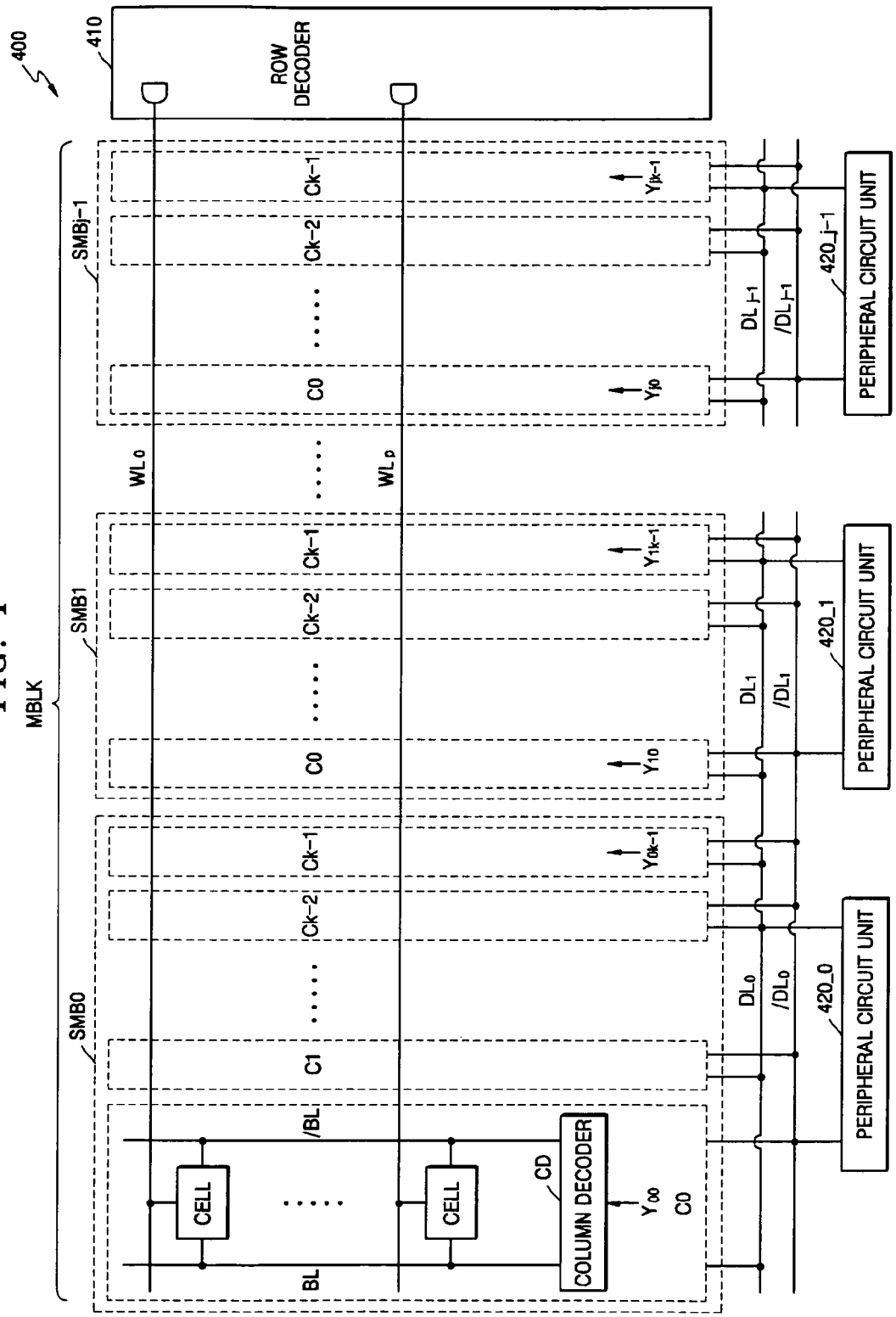
FIG. 4 is a block diagram illustrating an SRAM device capable of performing a burst operation according to an exemplary embodiment of the present invention.

The present invention will now be described more fully with reference to the accompanying drawings in which exemplary embodiments of the invention are shown. In the drawings, like reference numerals represent like elements. Referring initially to FIG. 4, a block diagram illustrates a static random access memory (SRAM) device according to an exemplary embodiment of the invention. In particular, as explained below, FIG. 4 illustrates an SRAM device 400 that is capable of performing a burst operation whereby n-bit data can be simultaneously written/read to/from memory by activating a single wordline.

In general, the SRAM device 400 includes a memory block MBLK and j peripheral circuit units (420_0~420_j−1) generally denoted 420, where j is a natural number. The memory block MBLK includes j sub-memory blocks (SMB0~SMB(j−1)), generally denoted as SMB. Each sub-memory block SMB includes k column units (C0, C1 . . . Ck−1), generally denoted C. In this regard, the memory block MBLK of the SRAM device 400 includes a total of i column units C, where i=k×j. Each the column unit (C0~Ck−1) includes a respective column decoder CD and a plurality of memory cells commonly connected to a corresponding bit line pair BL and /BL that is activated by a respective column decoder CD. In general, each column decoder CD generates column selection signals Y0~Yk−1 for selectively activation bit line pairs (BL and /BL) of the corresponding column units (C0~Ck−1) in corresponding sub-memory blocks SMB.

Each peripheral circuit unit (420_0~420_j−1) corresponds to a respective one of the sub-memory blocks (SMB0~SMBj−1) and control the inputting/outputting of data to/from memory cells in the respective sub-memory block (SMB0~SMBj−1) to perform burst operations and read/write operations upon interruption of burst operations. The peripheral circuit units (420_0~420_j−1) are connected to respective sub-memory blocks (SMB0~SMBj−1) by j pairs of respective data lines (DL0 and /DL0~DLj−1 and /DLj−1). The SRAM device 400 comprises a plurality of wordlines ($WL_0$~$WL_p$) connected to a row decoder 410. The memory cells in each row of the memory block MBLK across ($WL_0$~$WL_p$).

With the exemplary SRAM framework of FIG. 4, a plurality of data bits can be processed at the same time by selecting one wordline and simultaneously driving a bit line pair in some or all of the sub-memory blocks SMB. In particular, by way of example, a burst data access operation can be generally performed as follows. A plurality of memory cells connected in a given row direction can be simultaneously selected by activating one of the wordlines ($WL_0$~$WL_p$). A column decoder selection signal Y can be generated by each column decoder to select one of the plurality of bitline pairs (BL and /BL) in each of the sub-memory blocks (SMB0~SMBj−1) so that a total of j memory cells in the memory block MBLK are simultaneously selected.

Further, since the memory block MBLK includes j data line pairs DL, /DL, and j peripheral circuit units (420_0~420_j−1), a total of j memory cell data can be processed in parallel by the peripheral circuit units (420_~420_j−1). In this regard, in a burst operation, the SRAM device 400 can process n-bit data at the same time by selecting only one wordline and simultaneously driving a plurality of bitline pairs, where n is less than or equal to j. In other words, for a burst operation, all or some of the sub-memory blocks SMB can simultaneously output or receive 1 data bit of n-bit data. Exemplary burst operations will be discussed below with reference to FIGS. 7A and 7B, for example.

In other exemplary embodiments of the invention, the SRAM device 100 can support interruption of burst operations, where new write or read commands are issued before a burst operation is complete. In such instance, only part of the n-bit data is stored in the peripheral circuit units (420_~420_j−1), and the peripheral circuit units (420_~420_j−1) control the writing of the stored data to the respective sub-memory blocks (SMB0~SMBj−1) or the reading of the stored data in response to a flag signal (discussed below). An exemplary architecture and mode of operation of the peripheral circuit units (420_0~420_j−1) will be described in further detail hereafter.

Figure 5:
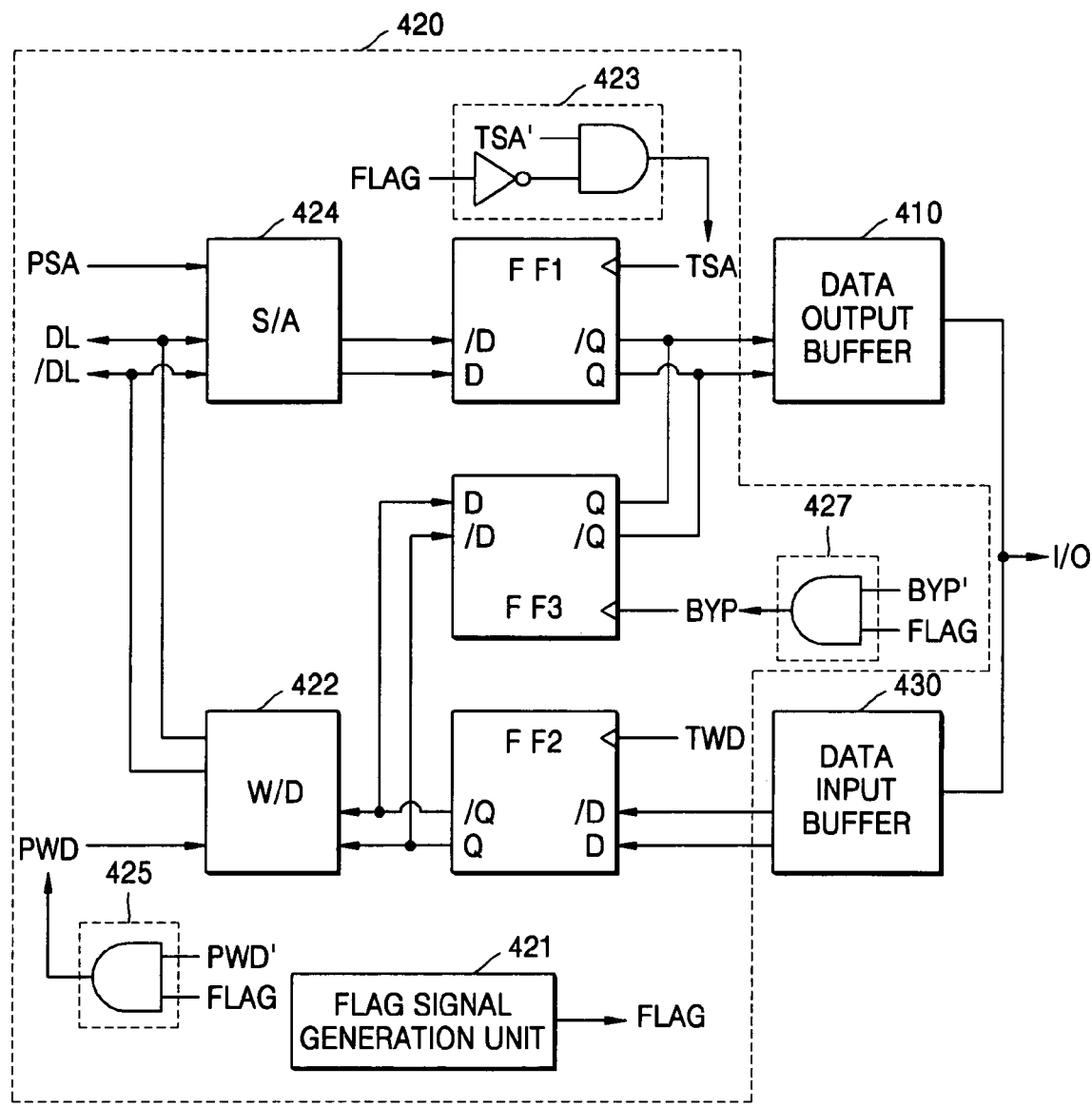
FIG. 5 is a block diagram illustrating a peripheral circuit unit depicted in FIG. 4, according to an exemplary embodiment of the invention.

FIG. 5 is a block diagram illustrating an exemplary framework of a peripheral circuit unit according to an exemplary embodiment of the invention, which can be implemented for each of the peripheral circuit units (420_0~420_j−1) of FIG. 4. For illustrative purposes, FIG. 5 illustrates only one of the peripheral circuit units of FIG. 4, which is generally denoted 420. Referring to FIG. 5, in one exemplary embodiment, the peripheral circuit unit 420 includes a write driver W/D 422, a sense amplification circuit S/A 424, and first through third storage units FF1, FF2 and FF3. For the convenience of explanation, a data output buffer 410 and a data input buffer 430 are also illustrated in FIG. 5 together with the peripheral circuit unit 420. In another exemplary embodiment of the invention, the peripheral circuit unit 420 may further include a flag signal generation unit 421, and first through third control units 423, 425, and 427, which are optional modules that are employed to support burst stop operations, as will be discussed in detail below.

In general, the write driver W/D 422 writes data to a corresponding one of the sub-memory blocks SMB of the memory block MBLK of FIG. 4 in response to the write control signal PWD. The sense amplification circuit S/A 424 amplifies data output from the corresponding sub-memory block SMB in response to a read control signal PSA and outputs the amplified data. The first storage unit FF1 latches data that is output from the sense amplification circuit S/A 424 and outputs the latched data to the data output buffer 410 in response to a first control signal TSA. The second storage unit FF2 latches data that is input from the data input buffer 430 and outputs the latched data to the write driver W/D 422 in response to a second control signal TWD. The third storage unit FF3 latches the data output from the second storage unit FF2 and outputs the latched data to the data output buffer 410 in response to a third control signal BYP. In the exemplary embodiment of FIG. 5, the storage units FF1, FF2 and FF3 are implemented as flip-flops, although such storage units can be implemented using other types of storage devices, such as registers.

Figure 2:
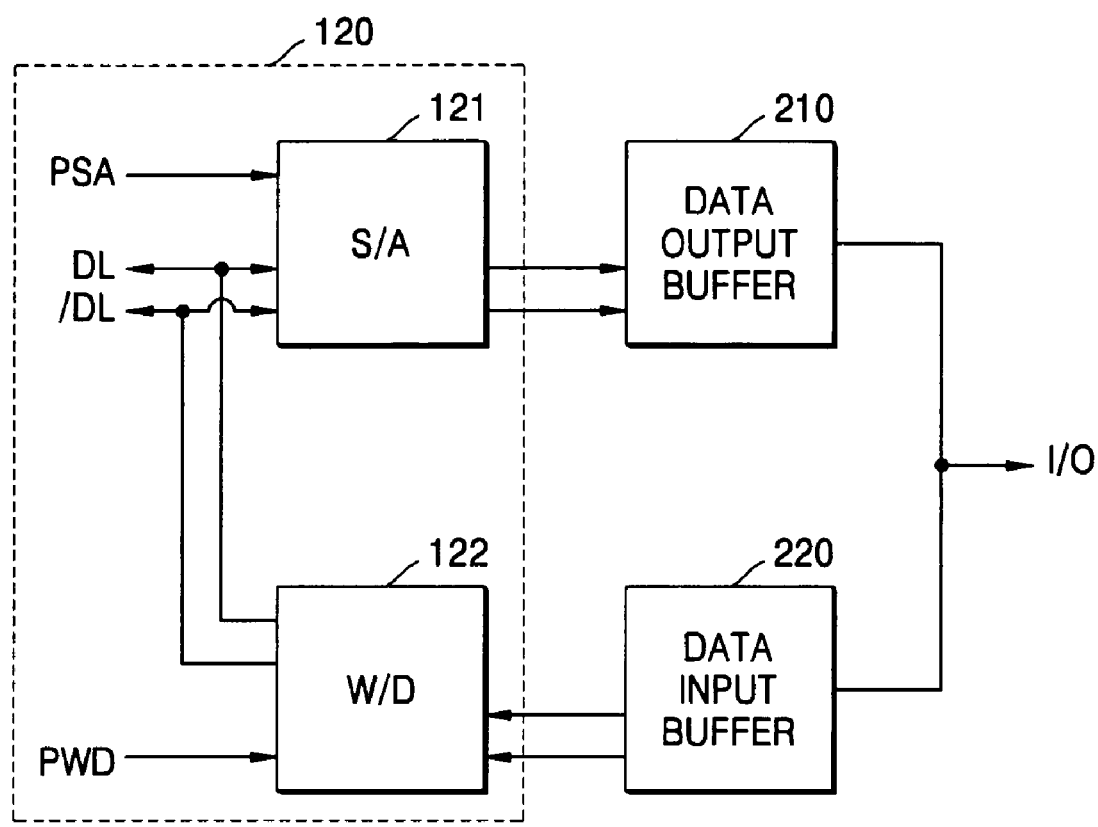
FIG. 2 is a block diagram illustrating a conventional architecture of a peripheral circuit unit depicted in FIG. 1.
Figure 3A:
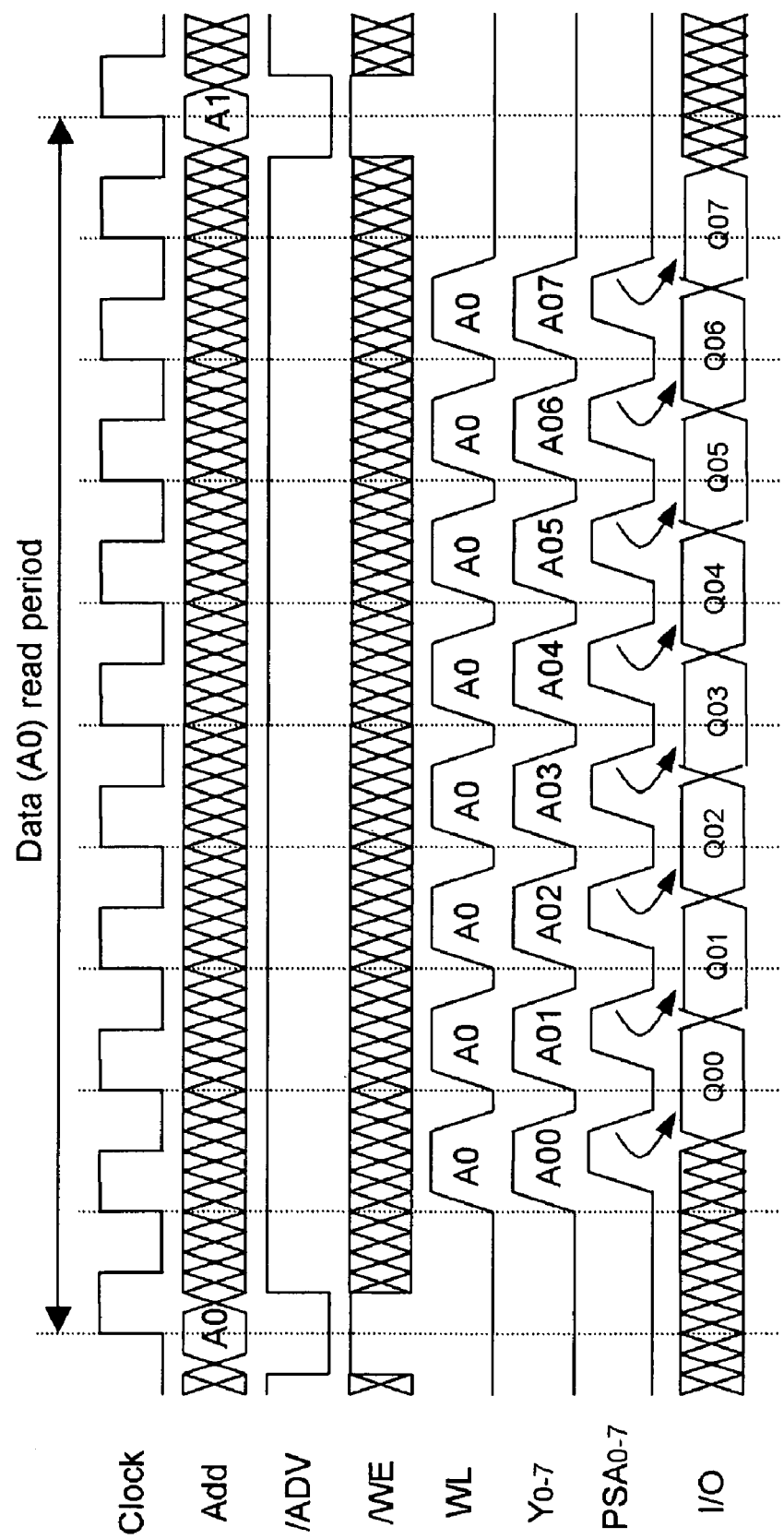
FIG. 3A is a timing diagram illustrating a conventional burst read operation performed by the SRAM device of FIG. 1.
Figure 3B:
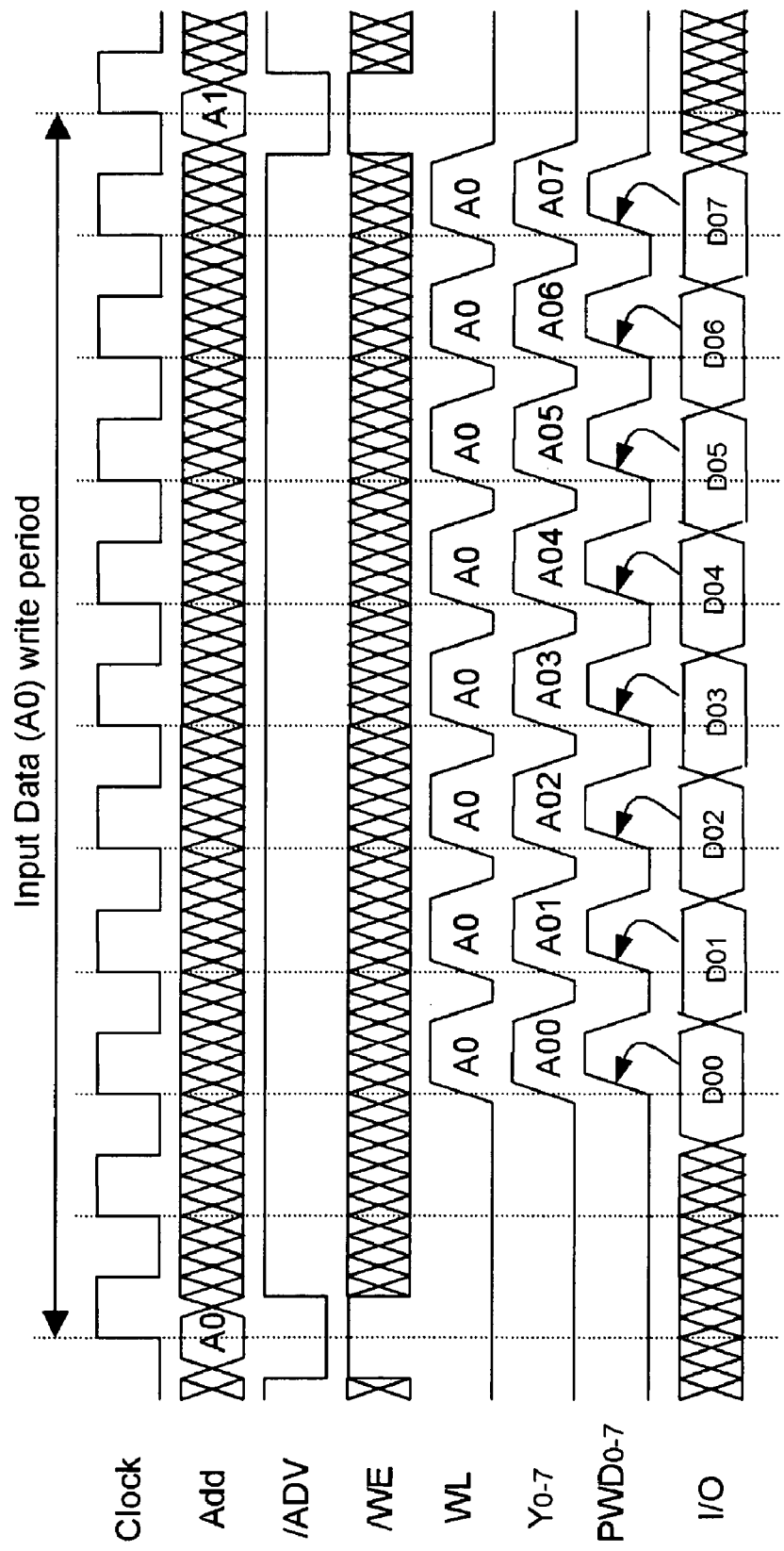
FIG. 3B is a timing diagram illustrating a conventional burst write operation performed by the SRAM device of FIG. 1.

In one exemplary embodiment, each of the peripheral circuit units (420_0~420_j−1) of FIG. 4 has a circuit framework as depicted in FIG. 5. In contrast to the single peripheral circuit unit 120 of FIG. 2, each peripheral circuit unit (420_0~420_j−1) includes storage units FF1, FF2 and FF3. In general, during an n-bit read burst operation, the first storage unit FF1 sequentially latches data bits that are output from the sense amplification circuit S/A 424. The first storage units FF1 each store a respective one of the n data bits which are simultaneously read from a memory cell in some or all of the sub-memory blocks SMB (i.e., n less than or equal to j) and amplified by the sense amplification circuits S/A 42. The first storage units then sequentially output the n data bits to the data output buffer 410 in synchronization with a clock signal. An exemplary read burst operation will be described below with reference to FIG. 7A.

Furthermore, during an n-bit write burst operation, the second storage units FF2 sequentially latch one of n data bits input from the data input buffer 430. When data corresponding to a predetermined burst length (e.g., n less than or equal to j) is input to the second storage units FF2, the second storage units FF2 will transmit their respective data bits to respective write drivers W/D 422 are the same time so that the data can be simultaneously written to n memory cells in response to a write command (in a late write manner) upon activation of a wordline.

Moreover, if a burst stop operation is performed in response to a write or read command issued before the SRAM device 400 completes a burst operation, a portion of the n-bit data is stored in the first or second storage unit FF1 or FF2. The portion of the n-bit data stored in the first or second storage unit may be written to the memory block MBLK or may be output from the peripheral circuit unit 420. The third storage units FF3 are temporary storage units that supports a bypass operation. For example, in a case where data is stored in the second storage units FF2 through a write operation, but such data is yet to be written to a predetermined address in the memory block MBLK and there is a need to read data from the predetermined address, the third storage units FF3 perform a bypass operation for directly connecting the data stored in the respective second storage units FF2 to the data output buffer 410.

Figure 6:
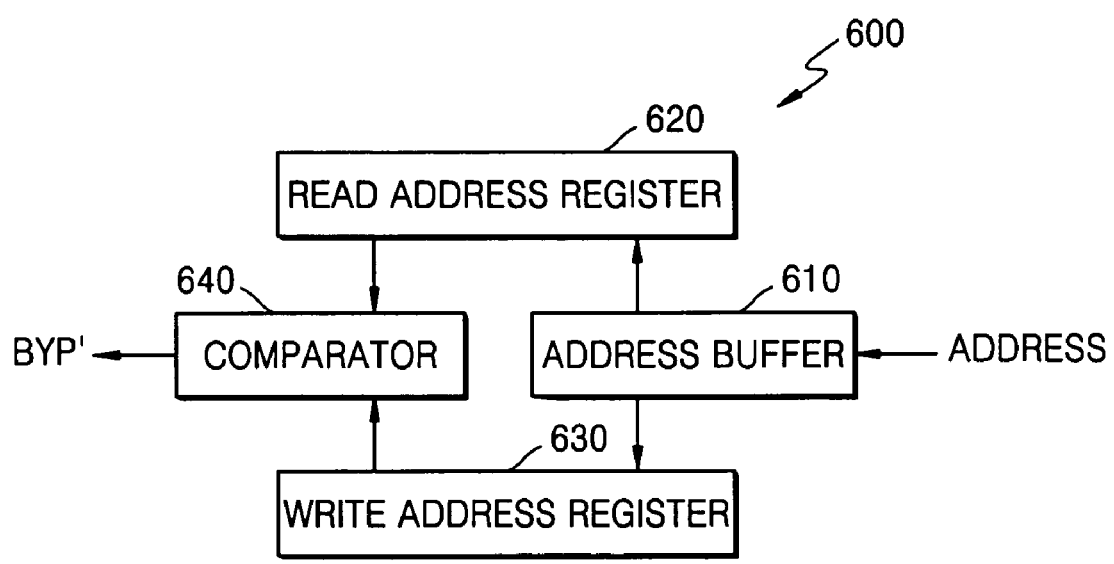
FIG. 6 is a block diagram illustrating a bypass comparison unit according to an exemplary embodiment of the invention.

FIG. 6 is a block diagram illustrating a bypass comparison unit 600 according to an exemplary embodiment of the invention, which can be implemented in each of the peripheral circuit units (420_0~420_j−1) of FIG. 4 and used by the third storage units FF3 to perform a bypass operation. Referring to FIG. 6, the bypass comparison unit 600 includes an address buffer 610, a read address register 620, a write address register 630, and a comparator 640. An address to which data has been most recently written is input to the write address register 630 until a new address for a subsequent write operation is input to the write address register 630. In addition, the address to which data has been most recently written is compared with an address stored in the read address register 620 by the comparator 640. If the comparison results show that the address to which data has been most recently written is identical to the address stored in the read address register 620, a third preliminary control signal BYP', which is an output signal of the comparator 640, has a first level. If the third preliminary control signal BYP' has the first level, data stored in the second storage unit FF2 is transferred to the data output buffer 410 via the third storage unit FF3 and then output. Depending on the implementation, the first level may be a logic high or low level, for example.

Figure 7A:
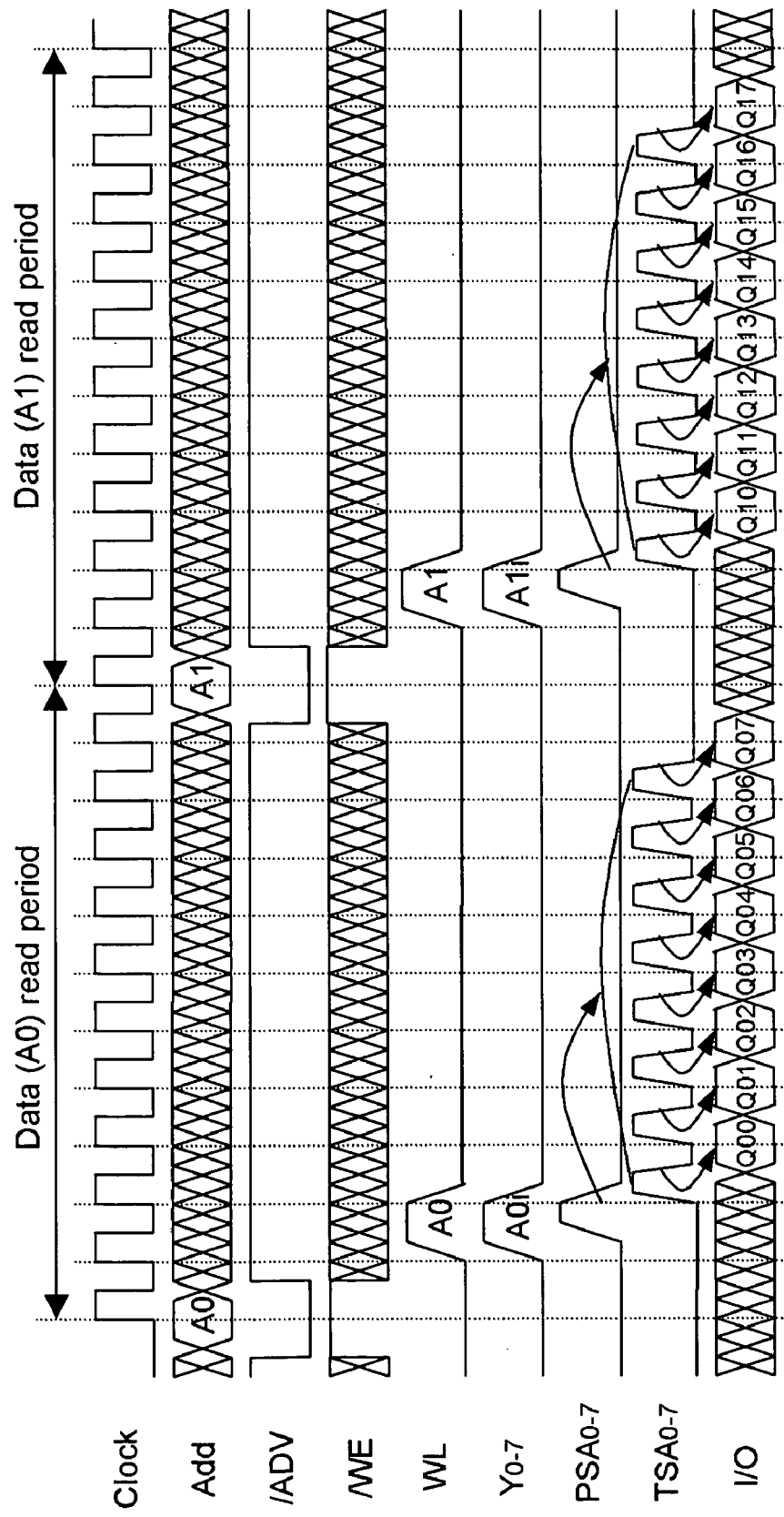
FIG. 7A is a timing diagram illustrating a burst read operation performed by an SRAM device according to an exemplary embodiment of the invention.

FIG. 7A is a timing diagram illustrating an exemplary read burst operation that can be performed by the SRAM device 400 of FIG. 4 having peripheral circuits units with frameworks as depicted in FIG. 5. The following exemplary read operation will be described with reference to FIGS. 4, 5 and 7A, and assuming a burst length n=8 bits, and where n=j. When a burst address A0 is applied to and recognized by the SRAM device 400 in a first cycle of a clock signal, a corresponding wordline WL is selected and j bitline pairs are simultaneously activated in response to column decoder selection signals Y0. More specifically, for address A0, the bitline pairs (BL and /BL) of column units C0 in each of the sub-memory blocks (SMB0~SMBj−1) are simultaneously activated so that a total of j=7 memory cells in the memory block MBLK is selected.

Thereafter, read control signals PSA0 through PSA7 are applied to activate respective sense amplification circuits 424 in the peripheral circuit units (420_0~420_7) which causes 8 data bits Q00 through Q07 to be simultaneously read out from 8 memory cells corresponding to the selected wordline WL and bitline pairs and amplified. The 8 data bits are stored in respective ones of the first storage units FF1 of the peripheral circuit units (420_0~420_7). The data bits Q00 through Q07 are then sequentially output from the SRAM device 400 via the data output buffer 410 in response to first control signals TSA0 through TSA7, which sequentially activate the first storage units FF1 of the peripheral circuit units (420_0~420_7) according to a predetermined latency. This process can be repeated for a subsequent address A1.

Figure 1:
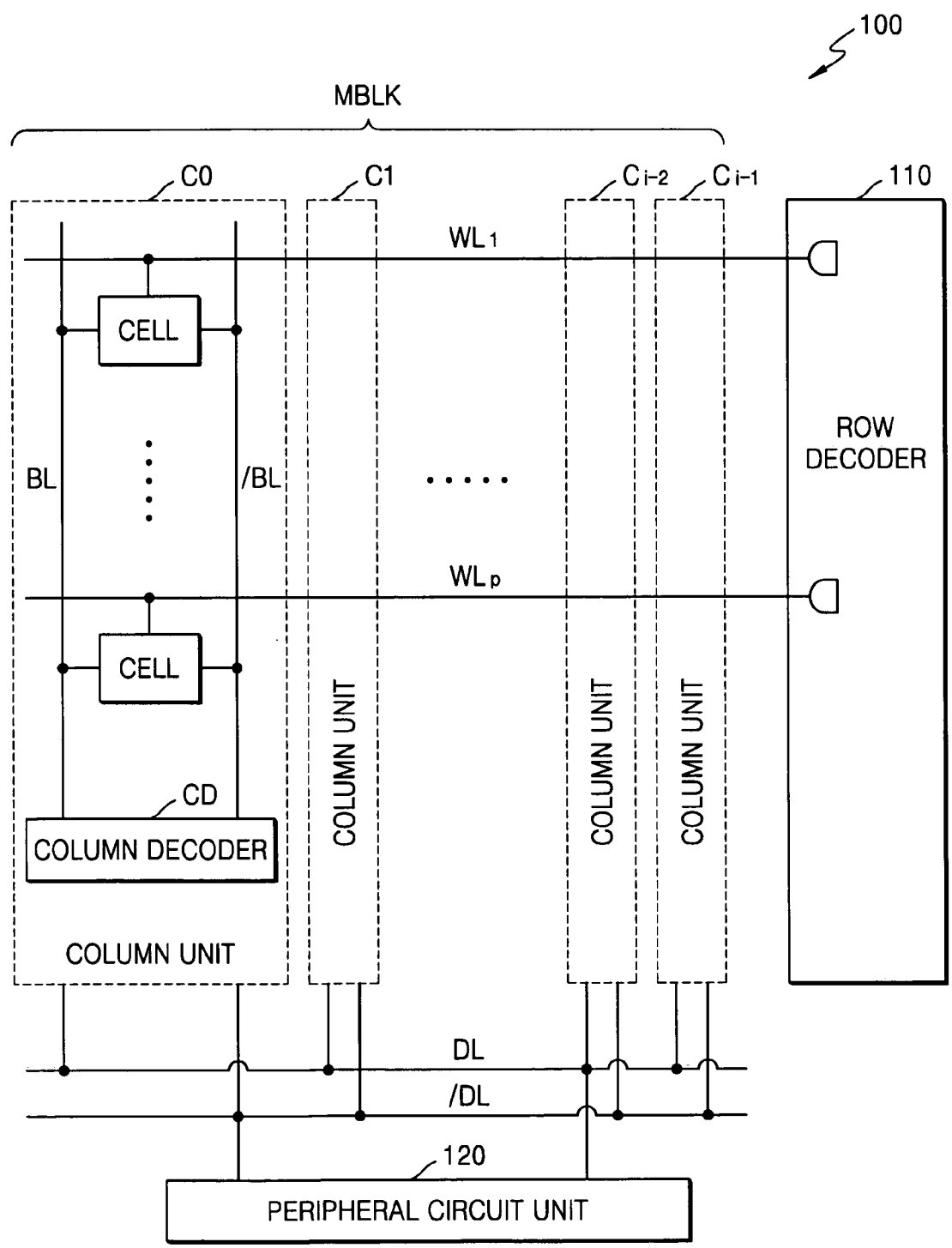
FIG. 1 is a block diagram illustrating a conventional architecture of a random access memory (SRAM) device.

It is to be appreciated that in contrast to the conventional SRAM device 100 of FIG. 1, the exemplary SRAM device 400 of FIG. 4 can simultaneously read bits of data of a burst length from the memory block MBLK by selecting a single wordline. Thus, it is possible to reduce the current consumption of the SRAM device 400 by as much as the amount of current required for performing a bitline precharge/discharge operation, which generally accounts for a large portion of the entire current consumption of a typical SRAM device.

In addition, in data read cycles other than a first data read cycle, data is read from the second and third storage units FF2 and FF3, rather than from the first storage unit FF1. Therefore, during the data read cycles other than a first data read cycle, the SRAM device 400 does not need to perform a decoding operation and a memory core operation. Thus, it is possible to enhance the speed of a read operation of the SRAM device 400.

Figure 7B:
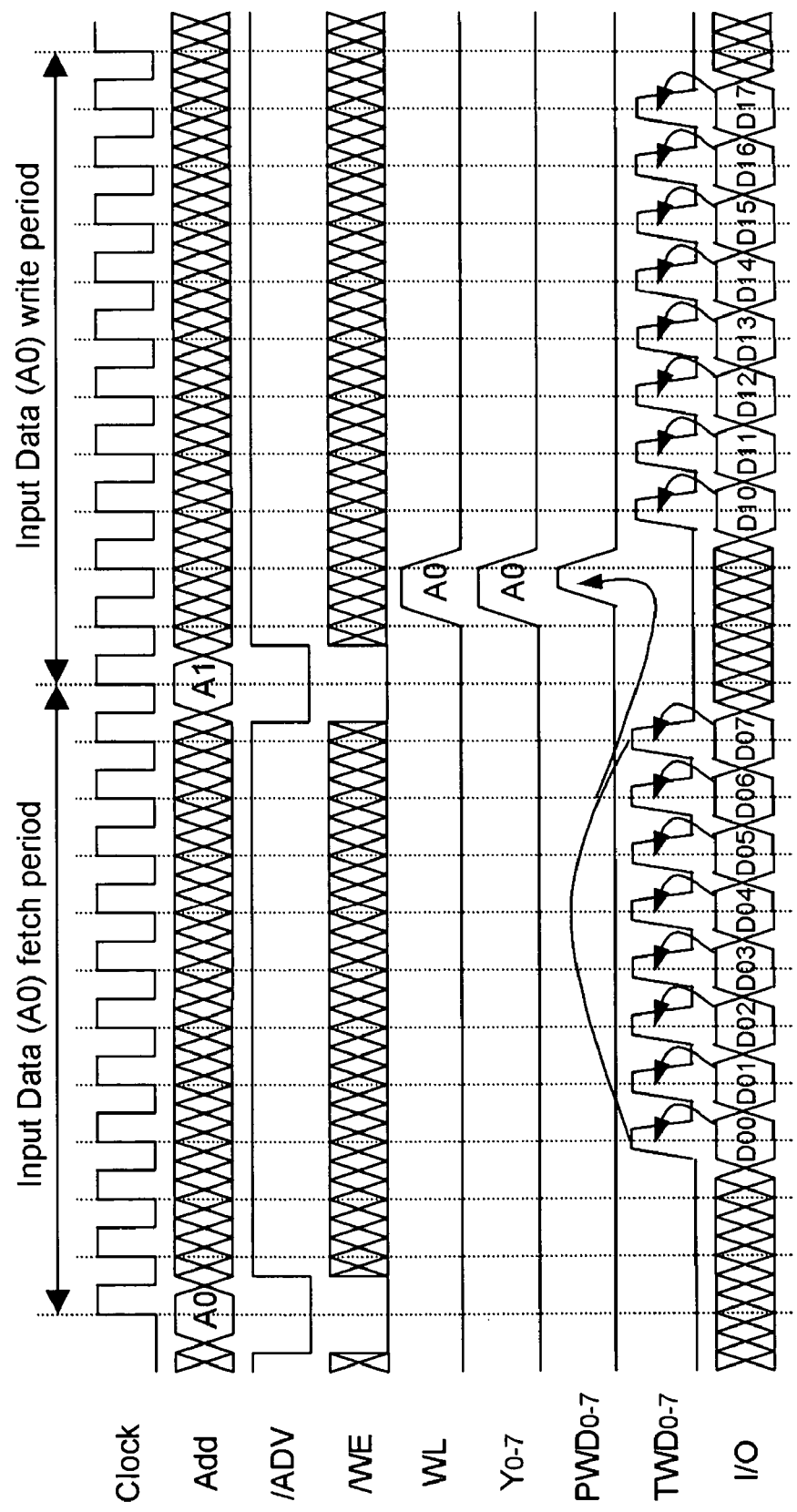
FIG. 7B is a timing diagram illustrating a burst write operation performed by an SRAM device according to an exemplary embodiment of the invention.

FIG. 7B is a timing diagram illustrating an exemplary write burst operation that can be performed by the SRAM device 400 of FIG. 4 having peripheral circuits units with frameworks as depicted in FIG. 5. The following exemplary write operation will be described with reference to FIGS. 4, 5 and 7B, and assuming a burst length n=8 bits, and where n=j. Referring to FIGS. 4, 5, and 7B, in a write operation, the SRAM device 400 sequentially receives data bits D00 through D07 with a predetermined latency there between via the data input buffer 430 in synchronization with a clock signal. More specifically, as depicted in FIG. 7B, during an input data fetch period for address A0, data bits D00 through D07 are sequentially stored in the second storage units FF2 of respective peripheral circuit units 420_0 through 420_7 in response to sequential activation of control signals TWD0~TWD7.

Thereafter, in the next period, i.e., the input data write period for address A0, a wordline WL corresponding to address A0 and column decoder selection signals Y0~Y7 are activated so that 8 bitline pairs are simultaneously activated. More specifically, for address A0, the bitline pairs (BL and /BL) of the column units C0 in each of the sub-memory blocks SMB0 through SMB7 are simultaneously activated in response to decoder selection signals Y0~Y7. Thereafter, write control signals PWD0~PWD7 are applied to simultaneously activate respective write drivers W/D 422, which causes the data bits D00 through D07 stored in corresponding storage units FF2 to be amplified and then written to the respective memory cells.

It is to be appreciated that in contrast to the conventional SRAM device of FIG. 1, the exemplary SRAM device 400 of FIG. 4 can simultaneously write bits of data of a burst length by selecting a single wordline. Thus, it is possible to reduce the current consumption of the SRAM device 400 by as much as the amount of current required for carrying out a bitline precharge/discharge operation, which generally accounts for a large portion of the entire current consumption of a typical SRAM device. In addition, it is possible to enhance the operating speed of the SRAM device 400.

In other exemplary embodiments of the invention, the exemplary memory device of FIG. 4 can employ mechanisms for controlling the input and output of data using burst stop commands. By way of example, for a burst write operation carried out in a late write manner (e.g., as in FIG. 7A), a burst stop command may be applied during a burst operation before completing the input of data corresponding to a burst length. In such instance, a portion of the burst data may be stored in one or more of the second storage units FF2, and the remaining burst data may be stored in one or more memory cells.

In another embodiment, a burst write operation may be stopped in response to a burst stop command and a command to read data from the address to which data has been most recently written in the burst write operation can be issued. In this instance, some of the data may be output from the memory block MBLK and some data may be output from the second storage units FF2.

In another embodiment, a command to write data to the address of the stopped write operation can be issued after the burst write operation is stopped in response to the burst stop command. In such instance, some of the bits stored in the second storage units FF2 are normally written to the memory block MBLK, but other bits stored in the second storage unit FF2 are not written to the memory block MBLK.

In one exemplary embodiment of the invention, the flag signal generation unit 421 and first through third control units 423, 425, and 427, as shown in FIG. 5, are employed for controlling the input/output of data in response to burst stop commands. As explained in further detail below, these control modules provide mechanisms to determine whether data is to be read from the memory cells of the memory block MBLK or from the second storage unit FF2 or whether data is to be written to the memory cells of the memory block MBLK by determining whether each of a plurality of bits of data corresponding to a predetermined burst length is valid.

Figure 8:
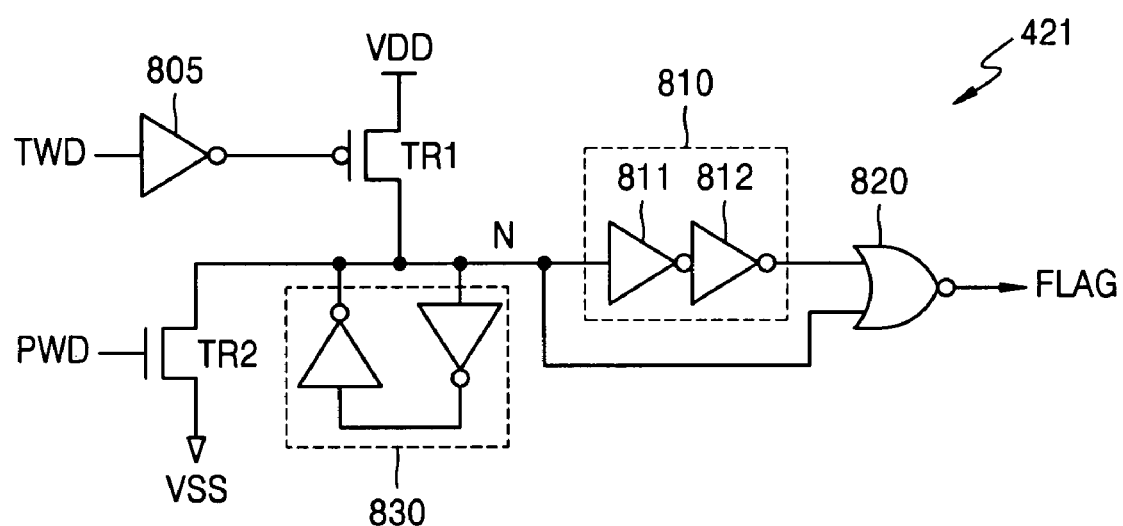
FIG. 8 is a circuit diagram illustrating a flag signal generation unit according to an exemplary embodiment of the invention.

FIG. 8 is a circuit diagram of the flag signal generation unit 421 of FIG. 5 according to an exemplary embodiment of the invention. The flag signal generation unit 421 generates a flag signal FLAG in response to a burst stop operation, and the flag signal FLAG is input to each of the control units 423, 425 and 427, as depicted in FIG. 5. By way of example, in one embodiment, if a burst stop operation is executed in the middle of a burst operation so that the inputting of n-bit data is incomplete and thus only part of the n-bit burst data is stored in one or more of the second storage units FF2, the flag signal FLAG is generated to select part of the data stored in the second storage unit(s) FF2 and apply the selected data to respective write drivers W/D 422 in a subsequent write cycle.

Further, if a bust stop operation is executed in the middle of a burst operation for receiving n-bit data so that only part of the n-bit data is stored in the second storage unit(s) FF2 and there is a need to read the data stored in the second storage unit(s) FF2 in response to a read command, the flag signal generation unit 421 selects part of the data stored in the second storage unit(s) FF2 and outputs the selected data to outside the flag signal generation unit 421 through the third storage unit FF3 and controls other parts of the n-bit data that are not stored in the FF2 to be output from the memory block MBLK.

Referring to FIG. 8, the flag signal generation unit 421 includes first and second transistors TR1 and TR2, a delay unit 810, and a logic OR unit 820. The first transistor TR1 is connected between a power supply VDD and a control node N, and an inverted signal of the second control signal TWD is applied to the gate of the first transistor TR1. The inverted signal of the second control signal TWD is generated by an inverter 805.

The second transistor TR2 is connected between the control node N and a ground VSS, and the write control signal PWD is applied to the gate of the second transistor TR2. The delay unit 810 delays an output of the control node N and outputs the delayed result. The delay unit 810 includes inverters 811 and 812. In other embodiments, the delay unit 810 may include more or less than 2 inverters. To maintain the logic level of an output signal of the delay unit 810 to be the same as the logic level of an input signal of the delay unit 810, the number of inverters included in the delay unit 810 is a multiple of 2.

The logic OR unit 820 performs a logic OR operation on the output of the control node N and an output of the delay unit 810, thereby generating the flag signal FLAG. The flag signal generation unit 421 may also include a latch unit 830 which maintains the voltage of the control node N.

As depicted in the exemplary embodiment of FIG. 5, the FLAG signal is applied to the first, second, and third control units 423, 425, and 427. Each of the control units 423, 425 and 427 include a logic AND gate and the first control unit 423 further includes an inverter connected to one input of the AND gate. The first control unit 423 performs a logic AND operation on the inverted signal of the flag signal FLAG and a first preliminary control signal TSA', thereby generating control signal TSA to control the first storage device FF1. The second control unit 425 performs a logic AND operation on the flag signal FLAG and a second preliminary control signal PWD', thereby generating the write control signal PWD to control the write driver 422. The third control unit 427 performs a logic AND operation on the flag signal FLAG and a third preliminary control signal BYP', thereby generating the third control signal BYP to control the third storage device FF3.

The first preliminary control signal TSA' is a pulse signal activated whenever the sense amplification circuit S/A 424 outputs data in response to a read command. The second preliminary control signal PWD' is a pulse signal activated whenever data stored in the second storage unit FF2 is input to a memory cell in response to a write command. The third preliminary control signal BYP' is a pulse signal activated whenever a read address which is the same as a most recently input write address is input. The flag signal FLAG is activated to a first logic level when the second control signal TWD is activated. The flag signal FLAG is inactivated to a second logic level when the write control signal PWD is activated to the first logic level.

Figure 9A:
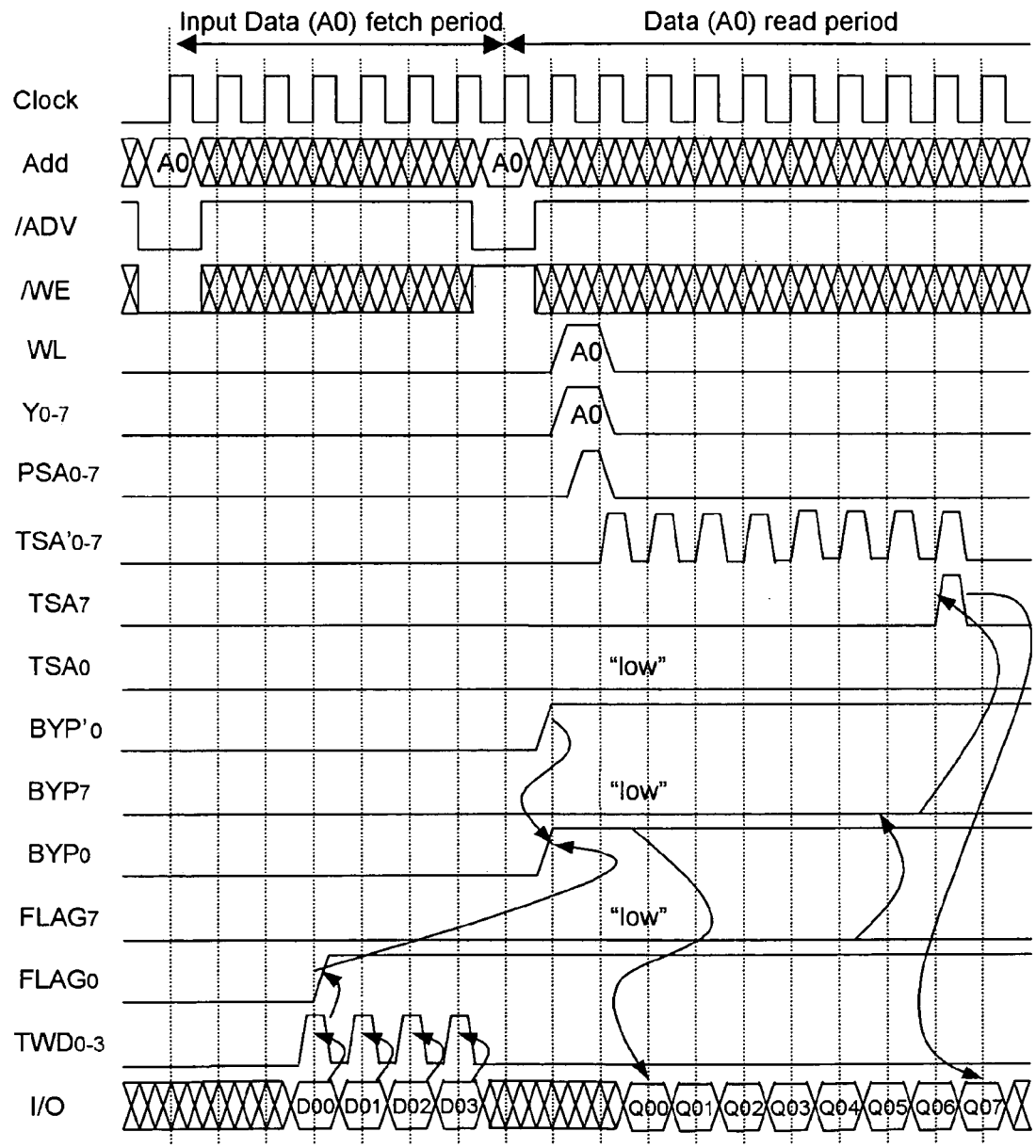
FIG. 9A is a timing diagram illustrating a method for performing a read operation upon interruption of a burst write operation, according to an exemplary embodiment of the invention.

FIG. 9A is a timing diagram that illustrates a method for performing a read operation when a burst stop is used prior to completion of a burst write operation, according to an exemplary embodiment of the invention. The exemplary read operation will be explained with reference to FIGS. 9A, 4, 5 and 8, and assumes that a burst length n=8 bits and a burst stop operation is executed after 4 data bits D00, D01, D02, and D03 (of address A0) have been input in the input data (A0) fetch period during a burst write operation. In FIG. 9A, in a data (A0) read period, a read operation is commenced to read 8 data bits D00 through D07 from memory. In this instance, 4 data bits D00, D01, D02, and D03, which were input in the previous input data fetch period, are stored in respective second storage units FF2 and are yet to be written to memory. The 4 data bits D04, D05, D06, and D07 in memory, which were written in some previous write operation, are to be read from the memory cell. A determination is made as to whether the data D00 through D07 is valid.

When data bit D00 is input during a burst write operation cycle, a second control signal TWD0 is activated to a logic high level, which causes the data bit D00 to be stored in the second storage unit FF2 of peripheral circuit unit 420_0. In FIG. 8, since the second control signal TWD0 is logic high, the first transistor TR1 of the flag signal generation unit 421 is turned ON and thus generates a flag signal FLAG having a logic high level. Moreover, since a write control signal PWD0 is logic low, the second transistor TR2 of the flag signal generation unit 421 is turned OFF.

When a write operation is performed normally, the second control signals TWD0 through TWD3 are toggled between a logic high level and a logic low level and, thus, flag signals FLAG0 through FLAG3 are generated and maintained logic high while the data bits D00 through D03 are stored normally in respective second storage units FF2.

In the exemplary embodiment of FIG. 9A, a burst stop command occurs after the 4-bit data D00 through D03 are stored in respective second storage units FF2. Consequently, the second control signals TWD4 through TWD7 are not activated, and respective flag signals FLAG4 through FLAG7 are maintained logic low. In particular, when the memory device 400 is powered up, the power control signal PWD is activated once to a logic high level, which sets control node N to a low voltage level and maintains the flag signals FLAG0~FLAG7 to be logic low. Therefore, in the above example, since the second control signals TWD4 through TWD7 are not activated (due to the burst stop), the corresponding flag signals FLAG4 through FLAG7 are maintained logic low. It is to be understood that for ease of illustration, FIG. 9A only illustrates the waveforms of the flag signals FLAG0 and FLAG7.

On the other hand, while the 4 data bits D00 through D003 are stored in respective second storage units FF2, the flag signals FLAG0 through FLAG3 are logic high, and the second and third controllers 425 and 427 operate to set the logic levels of the write control signal PWD and the third control signal BYP based on the logic levels of the second and third preliminary control signals PWD' and BYP'.

To read an address on which a write operation was previously performed before the burst stop, a word line WL corresponding to the address, column decoder selection signals Y0 through Y7, and read control signals PSA0 through PSA7 are simultaneously activated, and 8 data bits that are stored in memory are stored in respective first storage units FF1 regardless of whether the 8-bit data is valid.

At this time, the bypass comparison unit 600 of FIG. 6 generates third preliminary control signals BYP'0 through BYP'3 having a logic high level. The controllers 427 of peripheral circuit units 420_0~420_3 perform a logic AND operation on respective flag signals FLAG0 through FLAG3 and third preliminary control signals BYP'0 through BYP'3, thereby generating respective third control signals BYP0 through BYP3 having a logic high level. In other words, the third control signals BYP0 through BYP3, which correspond to the 4-bit data D00 through D03 stored in respective second storage units FF2, become logic high, and the third control signals BYP4 through BYP7, which correspond to the 4-bit data D04 through D07 stored in memory, become logic low.

In addition, since first preliminary control signals TSA'0 through TSA'7 having a logic high level are generated in response to a read command and the flag signals FLAG0 through FLAG3, which correspond to the 4-bit data D00 through D03 stored in the second storage units FF2, become logic high, the first control unit 423 generates first control signals TSA0 through TSA3 having a logic low level for the 4-bit data stored in the second storage unit FF2 regardless of the logic levels of the first preliminary control signals TSA'0 through TSA'3.

In addition, since the flag signals FLAG4 through FLAG7, which correspond to the 4-bit data D04 through D07 stored in the memory cell, become logic low, the first control unit 423 generate first control signals TSA4 through TSA7 having a logic high level for the 4-bit data D04 through D07 stored in the memory cell in response to the first preliminary control signals TSA'4 through TSA'7 having a logic high level.

Therefore, since the first control signals TSA0 through TSA3, which correspond to the 4-bit data D00 through D03 stored in the second storage units FF2, are logic low and the third control signals BYP0 through BYP3 are logic high, the 4-bit data D00 through D03 stored in the second storage unit FF2 are output to the data output buffer 410.

On the other hand, since the first control signals TSA4 through TSA7, which correspond to the 4-bit data D04 through D07 stored in memory, are logic high and the third control signals BYP4 through BYP7 are logic low, the 4-bit data D04 through D07 are output to the data output buffer 410.

As described above, for ease of illustration, FIG. 9A only illustrates the first control signal TSA0, the third control signal BYP0, the third preliminary control signal BYP', and the flag signal FLAG0 for the 4-bit data D00 through D03 stored in the second storage unit FF2 and the first control signal TSA7, the third control signal BYP7, and the flag signal FLAG7 for the 4-bit data D04 through D07 stored in the memory cell.

Figure 9B:
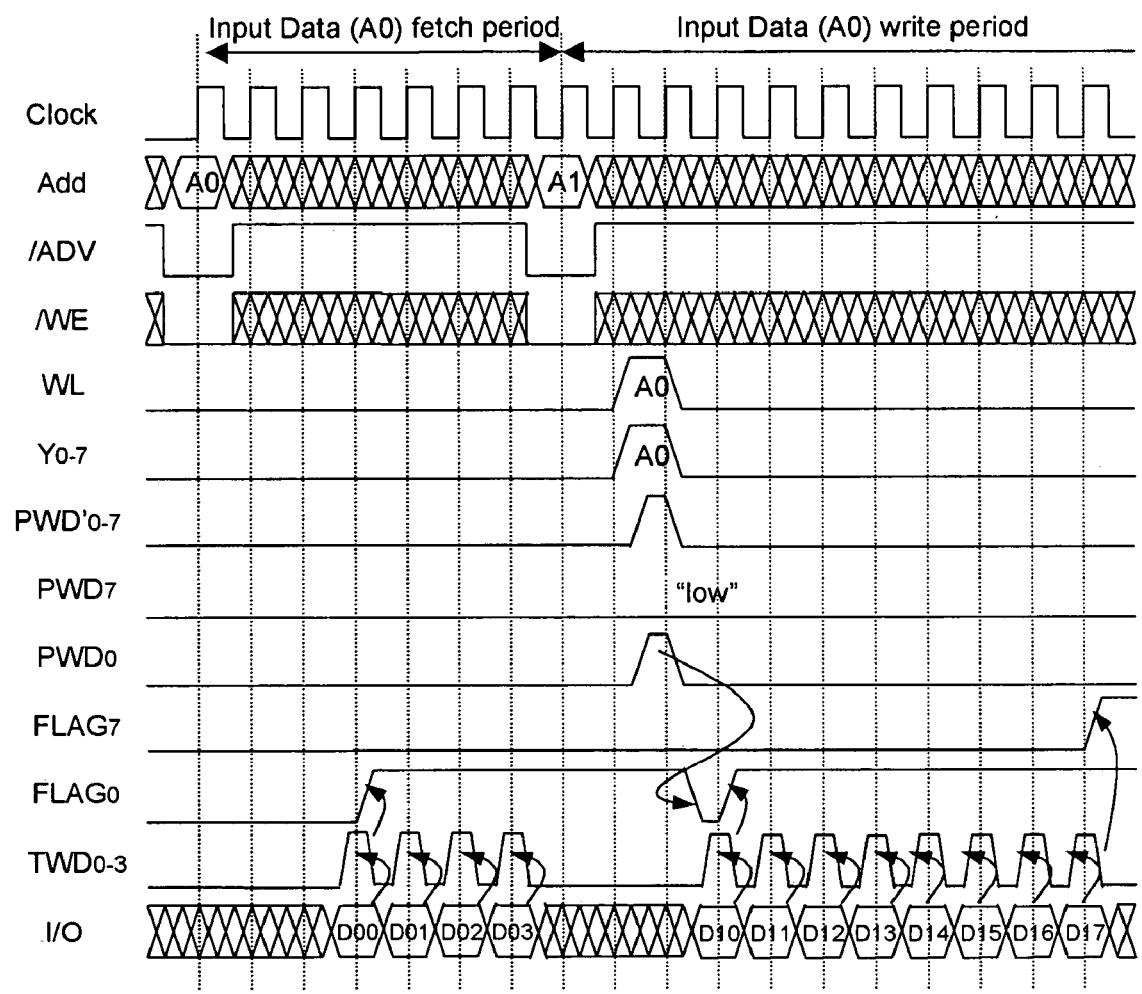
FIG. 9B is a timing diagram illustrating a method for performing a write operation upon interruption of a burst write operation, according to an exemplary embodiment of the invention.

FIG. 9B is a timing diagram that illustrates a write operation performed on a new address when a burst stop occurs in the middle of a burst write operation, according to an exemplary embodiment of the invention. In FIG. 9B, it is assumed that a burst length n=8 bits and a burst stop occurs after 4 data bits D00 through D03 corresponding to an address A0, are input and stored in respective storage units FF2. Since the burst stop occurs after the data bits D00 through D03 are stored in respective second storage units FF2 and a subsequent write cycle begins, the data bits D00 through D03 must be written to a memory cell in a late write manner during the subsequent write cycle.

When writing the 4 data bits D00 through D03 to memory at address A0, the data bits D04 through D07 that are stored in the respective second storage unit FF2 must not be written to memory because such data bits were not updated due to the burst stop. In this regard, a determination is made as to which of the data bits D00 through D07 stored in the respective second storage units FF2 are valid and should be written to the memory cell. For ease of illustration, FIG. 9B illustrates write control signal PWD0 and the flag signal FLAG0 for the data D00 and the write control signal PWD7 and the flag signal FLAG7 for the non-updated data D07.

In the exemplary embodiment of FIG. 9B, it is assumed that the data bits D00 through D03 for address A0 were stored in respective second storage units FF2 during a previous write cycle (input data (A0) fetch period), the flag signals FLAG0 through FLAG3 corresponding to the data bits D00 through D03 are generated to have a logic high level, and flag signals FLAG4 through FLAG7 corresponding to the non-updated data bits D04 through D07 for address A0 are maintained logic low.

In the subsequent A0 write period, where a write operation is performed on an address A1 other than the address A0 in a late write manner, a wordline WL corresponding to address A0, column decoder selection signals Y0 through Y7, and second preliminary control signals PWD'0 through PWD'7 are simultaneously activated. However, the second control units 425 for peripheral circuit units 420_0~420_3 generate respective write control signals PWD0 through PWD3 having logic high levels only when the flag signals FLAG0 through FLAG3 are logic high and the second control units 425 for peripheral circuit units 420_4~420_7 generate respective write control signals PWD4 through PWD7 having logic low levels when respective flag signals FLAG4 through FLAG7 become logic low.

Therefore, the data bits D00 through D03 stored in the respective second storage units FF2 are written to memory by respective write drivers W/D 424. However, the non-updated data bits D04 through D07 are not written to memory since the respective write drivers W/D 424 are not activated.

When the write control signals PWD0 through PWD3 become logic high to output data bits D00 through D03 from the second storage units FF2 to the respective write drivers W/D 424, the second transistors TR2 of respective the flag signal generation units 421 are turned ON to pull down the voltage of control node N, and the flag signals FLAG0 through FLAG3 temporarily become logic low due to the delay unit 810. In particular, the delay units 810 delay respective flag signals FLAG0 through FLAG3 so that such flag signals become logic low for a predetermined period of time after the voltage of the control node N are pulled down. This prevents the flag signals FLAG0 through FLAG3 from adversely affecting respective second control units 425 by being shifted to a logic low level immediately after the voltage of the control node N lowers and, thus, to prevent the effect on the duration in which the write control signal PWD is maintained logic high.

It is to be appreciated that exemplary embodiments of the invention such as described above provide mechanism to efficiently perform burst operations and control data input/output without the use of complex circuitry. Indeed, as described above, it is possible to determine whether predetermined data is valid when a burst stop occurs in the middle of a burst write operation or a burst read operation by using simple circuits such as the flag signal generation unit 421 of FIG. 5. Accordingly, it is possible to reduce the power consumption of the memory device while enhancing the operating speed of the memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device capable of performing a burst operation, the memory device comprising:
   a memory block comprising j sub-memory blocks; and
   j peripheral circuit units that control input/output of data to/from a corresponding one of the j sub-memory blocks,
   wherein during an n-bit burst operation, n of the j peripheral circuit units simultaneously write/read 1 bit of n-bit data to/from their corresponding sub-memory blocks upon activation of one wordline, and
   wherein when an n-bit burst operation is terminated in response to a new write or read command, and a portion of the n-bit data is stored in the peripheral circuit units, the peripheral circuit units control reading/writing of the stored portion of the n-bit data in response to a flag signal.

2. The memory device of claim 1, wherein each peripheral circuit unit comprises:
   a write driver to write data to a sub-memory block in response to a write control signal;
   a sense amplification circuit to amplify data output from the sub-memory block and output the amplified data in response to a read control signal;
   a first storage unit to latch the amplified data output from the sense amplification circuit and output the latched data in response to a first control signal;
   a second storage unit to latch data and apply the latched data to the write driver in response to a second control signal; and
   a third storage unit to output data stored in the second storage unit in response to a third control signal.

3. The memory device of claim 2, wherein if a burst operation is terminated in response to the new read or write command, and part of the n-bit data is stored in the first or second storage unit, the first, second and third storage units operate to write the data stored in the first or second storage unit to a sub-memory memory block or to output the data stored in the first or second storage unit in response to the flag signal.

4. The memory device of claim 3, wherein the peripheral circuit unit further comprises a flag generation unit, wherein the flag generation unit generates the flag signal for controlling data stored in the second storage unit to be applied to the write driver when a part of the n-bit data is stored in the second storage unit.

5. The memory device of claim 4, wherein when a burst operation is terminated and a part of the n-bit data is stored in the second storage unit and the remaining data is stored in memory, and there is a need to read previously written data in response to the new read command, the flag signal generation unit selects part of the data stored in the second storage unit, outputs the selected data from the memory device through the third storage unit, and controls part of the n-bit data that has not been stored in the second storage unit to be output from the memory block.

6. The memory device of claim 5, wherein the flag signal generation unit comprises:
    a first transistor which is connected between a power supply and a control node and having a gate to which an inverted signal of the second control signal is applied;
    a second transistor which is connected between the control node and a ground and having a gate to which the write control signal is applied;
    a delay unit which delays an output of the control node and outputs the delayed result; and
    a logic OR unit which performs a logic OR operation on the output of the control node and an output of the delay unit, thereby generating the flag signal.

7. The memory device of claim 6, wherein each peripheral circuit unit further comprises:
    a first control unit which performs a logic AND operation on the inverted signal of the flag signal and a first preliminary control signal, thereby generating the first control signal;
    a second control unit which performs a logic AND operation on the flag signal and a second preliminary control signal, thereby generating the write control signal; and
    a third control unit which performs a logic AND operation on the flag signal and a third preliminary control signal, thereby generating the third control signal.

8. The memory device of claim 7, wherein the first preliminary control signal is a pulse signal activated when the sense amplification circuit outputs data in response to the read command, wherein the second preliminary control signal is a pulse signal activated when data is input in response to the write command, and wherein the third preliminary control signal is a pulse signal whenever a read address that is the same as a most recently input write address is input.

9. The memory device of claim 8, wherein the flag signal is activated to a first logic level when the second control signal is activated and is inactivated to a second logic level when the write control signal is activated to the first logic level.

10. The memory device of claim 9, wherein the first through third storage units are flip-flops.

11. The memory device of claim 1, wherein the memory device is a static random access memory (SRAM) device.

12. The memory device of claim 1, wherein j is equal to n.

13. A memory device capable of performing a burst operation, the memory device comprising:
    a memory block comprising j sub-memory blocks; and
    j peripheral circuit units that control input/output of data to/from a corresponding one of the j sub-memory blocks, wherein the j peripheral circuit units can simultaneously write/read 1 data bit to/from their corresponding sub-memory blocks upon activation of one wordline,
    wherein each peripheral circuit unit comprises:
    a write driver to write data to a sub-memory block in response to a write control signal;
    a sense amplification circuit to amplify data output from the sub-memory block and output the amplified data in response to a read control signal;
    a first storage unit to latch the amplified data output from the sense amplification circuit and output the latched data in response to a first control signal;
    a second storage unit to latch data and apply the latched data to the write driver in response to a second control signal; and
    a third storage unit to output data stored in the second storage unit in response to a third control signal.

* * * * *